US006747330B2

(12) United States Patent
Voorman et al.
(10) Patent No.: US 6,747,330 B2
(45) Date of Patent: Jun. 8, 2004

(54) CURRENT MIRROR CIRCUIT WITH INTERCONNECTED CONTROL ELECTRODIES COUPLED TO A BIAS VOLTAGE SOURCE

(75) Inventors: Johannes Otto Voorman, Eindhoven (NL); Gerben Willem De Jong, Eindhoven (NL); Rachid El Waffaoui, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 154 days.

(21) Appl. No.: 10/111,547

(22) PCT Filed: Aug. 29, 2001

(86) PCT No.: PCT/EP01/10110

§ 371 (c)(1),
(2), (4) Date: Apr. 24, 2002

(87) PCT Pub. No.: WO02/19050

PCT Pub. Date: Mar. 7, 2002

(65) Prior Publication Data

US 2002/0180490 A1 Dec. 5, 2002

(30) Foreign Application Priority Data

Sep. 1, 2000 (EP) ........................................... 00203033

(51) Int. Cl.[7] ........................... H01L 27/14; G06F 3/26
(52) U.S. Cl. ....................................... 257/428; 327/538
(58) Field of Search .......................... 257/428; 323/315, 323/316, 317; 327/490, 538; 330/288

(56) References Cited

U.S. PATENT DOCUMENTS 4,612,497 A * 9/1986 Ulmer ........................ 323/315
5,038,114 A * 8/1991 Blanken et al. ............. 330/288
5,596,297 A * 1/1997 McClure et al. ............ 327/538
5,834,814 A * 11/1998 Ito ............................. 257/378
6,323,723 B1 * 11/2001 Gul et al. ................... 327/538
6,424,204 B2 * 7/2002 Gul et al. ................... 327/538

FOREIGN PATENT DOCUMENTS

WO WO0031604 6/2000

* cited by examiner

*Primary Examiner*—Erik J. Kielin
*Assistant Examiner*—Stephen W. Smoot
(74) *Attorney, Agent, or Firm*—Michael E. Belk

(57) ABSTRACT

A current mirror circuit is described which includes a current input terminal (14A), a current output terminal (14B) and a common terminal (14C). A first controllable semiconductor element (T1) is arranged between the current input terminal (14A) and the common terminal (14C). A second controllable semiconductor element (T2) is arranged between the current output terminal (14B) and the common terminal (14C). The controllable semiconductor elements (T1, T2) have interconnected control electrodes (T1A, T2A) which are also coupled to a bias voltage source ($V_{BIAS}$), for biasing said control electrodes at a reference voltage. The circuit further includes a transconductance stage (12) with an input (12A) coupled to the current input terminal (14A) and an output (12B) coupled to the common terminal (14C). The control electrodes (T1A, T2A) are coupled to the common terminal (14C) via a third controllable semiconductor element (T3). The bias voltage source ($V_{BIAS}$) is coupled to the control electrodes of the first and the second controllable semiconductor element (T1, T2) via a control electrode (T3A) of the third controllable semiconductor element (T3). The current mirror circuit has high bandwidth also at low input currents and is very suitable for application in an arrangement for reproducing an optical record carrier.

12 Claims, 3 Drawing Sheets

CURRENT MIRROR CIRCUIT WITH INTERCONNECTED CONTROL ELECTRODIES COUPLED TO A BIAS VOLTAGE SOURCE

The invention pertains to a current mirror circuit including a current input terminal, a current output terminal and a common terminal, a first controllable semiconductor element arranged between the current input terminal and the common terminal, a second controllable semiconductor element arranged between the current output terminal and the common terminal, the controllable semiconductor elements having interconnected control electrodes which are also coupled to a bias voltage source, for biasing said control electrodes at a reference voltage, the circuit further including a transconductance stage having an input coupled to the current input terminal and an output coupled to the common terminal.

Such a current mirror circuit is known from WO 00/31604. In the known circuit the transconductance stage generates a current which is divided over the first and the second semiconductor element, so that the input voltage is maintained close to a reference voltage. It is realised therewith that the input impedance is significantly decreased so that a large bandwidth is obtained However, in the known circuit the imput impedance depends relatively strongly on the current amplification factor of the first and second controllable semiconductor elements, which on its turn is dependent on the input current. As the source of the input current generally has a finite impedance, this entails that the bandwidth of the mirror circuit is dependent on the input current.

It is an object of the invention to provide a current mirror circuit according to the opening paragraph in which the dependence of the bandwidth on the input current is reduced. According to the invention the current mirror circuit is characterized in that the control electrodes are coupled to the common terminal via a third controllable semiconductor element, and in that the bias voltage source is coupled to the control electrodes of the first and the second controllable semiconductor element via a control electrode of the third controllable semiconductor element. At a low input current the current amplification factor of the first and the second controllable semiconductor element strongly reduces. This has the effect that a relatively large current flows via the control electrodes of these semiconductor elements. In the current mirror circuit of the invention the current via the control electrodes to the common terminal flows back via the third controllable semiconductor element, so that this effect is compensated. As a result the input impedance, and therewith the bandwidth is less dependent on the input current.

In a preferrable embodiment the interconnected control electrodes are further connected to a current source. This current source may serve at the same time to bias the third semiconductor element and to bias a component of the transconductance stage.

A further preferable embodiment is characterized in that the first and the second semiconductor elements have an area ratio 1:P. In that way the circuit operates as a current amplifier.

A still further preferable embodiment is characterized in that the first and the second semiconductor elements are bridged by a first and a second capacitive impedances having a capacitive value with a ratio of 1 to P. This measure further improves the bandwidth. The high frequency components generated by the transconductance stage are divided over the first and the second capacitive impedances in a ratio determined by the ratios of their capacitive values. As the ratios of the capacitive values corresponds to the area ratios of the controllable semiconductor elements a flat amplification-frequency characteristic is obtained over a large frequency range.

Another preferable embodiment of the invention is characterized in that the interconnected control electrodes are further connected via a third capacitive impedance and via a fourth controllable semiconductor element to a reference voltage, and that a control electrode of the fourth controllable semiconductor element is coupled to the common terminal. In the circuit of the invention the common terminal shows relatively large voltage variations. These may induce losses via stray capacitances. The auxiliary circuit formed by the third capacitive element and the fourth controllable semiconductor element achieves that these losses are compensated for, as a result of which the bandwidth is still further improved.

An integrated circuit according to the invention comprises at least one current mirror circuit according to the invention, and a photodiode having an output coupled to its current input terminal. The integrated photodiodes have a relatively small capacitance as compared to discrete photo diodes, which is also favorable for the bandwidth.

Such an integrated circuit is described in more detail in the ANNEX: "High-Bandwidth Low-Capacitance Integrated Photo Diodes for Optical Storage".

BRIEF DESCRIPTION OF THE DRAWINGS

FIG. 1 schematically shows an integrated circuit comprising photodiodes A, . . . , F, the photodiodes A, . . . , D are coupled to current pre-amplifiers 1A, . . . , 1D and the photodiodes E and F are coupled to transimpedance amplifiers 3F and 3G respectively. The current pre-amplifiers 1A . . . , 1D each have a first output coupled to a respective transimpedance amplifier 2A, . . . , 2D. The current pre-amplifiers 1A, . . . , 1D each have a second output. The latter are interconnected as well as connected to the input of a further transimpedance amplifier 2RF.

Figure 2:
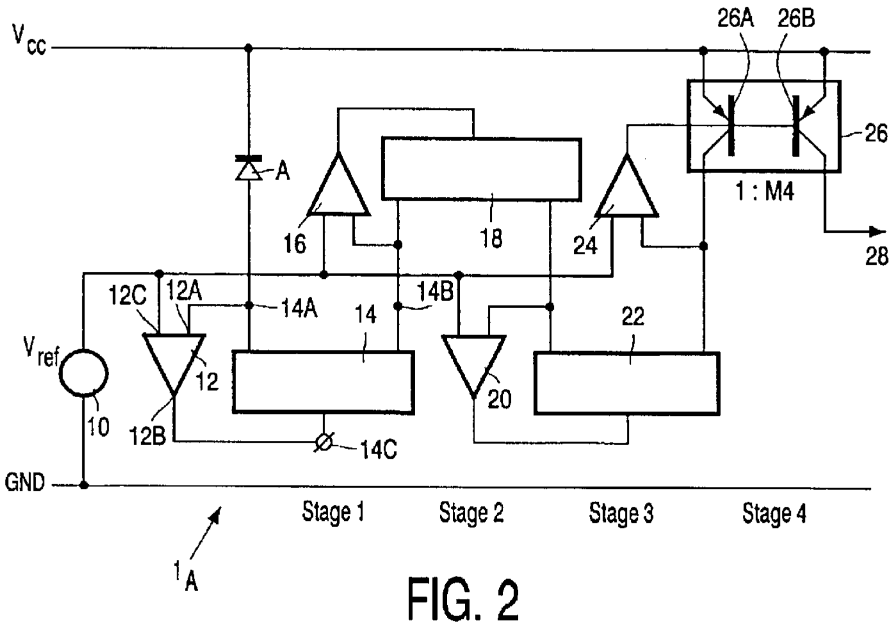
FIG. 2 is a detailed diagram of a current preamplifiers.

One of the current pre-amplifiers is shown in more detail in FIG. 2. The current amplifier comprises a cascade of current mirrors 14, 18, 22 and 26. to amplify the signal provided by the diode A. The current amplifier comprises a current mirror circuit 14 including a current input terminal 14A coupled to the photo diode A, a current output terminal 14B and a common terminal 14C. A transconductance stage 12 has an input 12A coupled to the current input terminal 14A and an output 12B coupled to the common terminal 14C. The transconductance stage has a further input 12C coupled to a reference voltage source 10. Likewise current mirror circuits 18 and 22 are coupled to a transconductance stage 16 and 20. Also the current mirror circuit 26 is coupled to a transconductance stage 24, but in this case the output of the transconductance stage 24 is coupled to the mutually interconnected control electrodes of the controllable semiconductor elements 26A, 26B forming part of this current mirror circuit.

Figure 3:
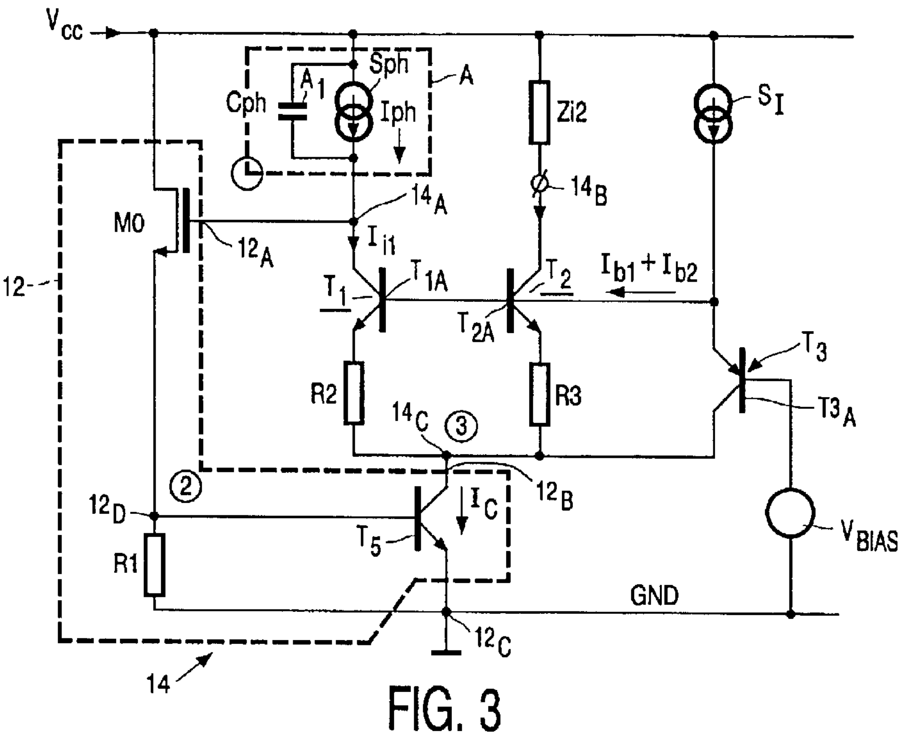
FIG. 3 is a current mirror stage according to the invention.

FIG. 3 shows an embodiment of a current mirror stage 14 according to the invention. The current mirror circuit includes a current input terminal 14A, a current output terminal 14B and a common terminal 14C. The input terminal 14A is connected to a photodiode A, which is represented here in the form of a signal current source Sph and a parasitic capacitance Cph. The output terminal 14B is connected to a load Zi2. A first controllable semiconductor element T1 is arranged between the current input terminal 14A and the common terminal 14C. A second controllable semiconductor element T2 is arranged between the current output terminal 14B and the common terminal 14C. In casu the semiconductor elements T1, T2 are connected to the common terminal via degeneration resistors R2, R3. The controllable semiconductor elements T1, T2 have interconnected control electrodes T1A, T2A which are also coupled to a bias voltage source $V_{BIAS}$, for biasing said control electrodes at a reference voltage.

The circuit further includes a transconductance stage 12 having an input 12A coupled to the current input terminal 14A and an output 12B coupled to the common terminal 14C.

The circuit according to the invention is characterized in that the interconnected control electrodes T1A, T2A are coupled to the common terminal via a third controllable semiconductor element T3, and in that the bias voltage source $V_{BIAS}$ is coupled to these control electrodes T1A, T2A via a control electrode T3A of the third controllable semiconductor element T3. The interconnected control electrodes T1A, T2A are further connected to a current source SI.

In the embodiment shown the transconductance stage 12 comprises a fifth controllable semiconductor element T5 which is arranged between its output 12B and ground GND. The fifth controllable semiconductor element T5 has a control electrode which is coupled to a common node 12D of a series arrangement of a further controllable semiconductor element MO and a resistive impedance R1. The current source SI both biases the third and the fifth controllable semiconductor elements T3 and T5.

The circuit shown in FIG. 3 operates as follows. If the photodiode provides a current Iph to the input terminal 14A of the current mirror, the transconductance stage 12 will withdraw a current Ic from the common terminal 14C of the current mirror such that the current Ii1 via the input terminal 14A equals the current Iph provided by the photodiode A. The operation of the current mirror formed by T1 and T2 has the effect that a current Io1 is delivered by the second controllable semiconductor element T2. The currents have a ratio Io1:Ii1=P, P being the area ratio of the controllable semiconductor elements T1, T2. At the same time the control electrodes T1A, T2A of the controllable semiconductor elements T1, T2 respectively conduct a current Ib1, Ib2 such that Ii1=α Ib1 and Io1=αIb2. As the third controllable semiconductor element T3 is biased by a current source, the signal currents Ib1+Ib2 will be conducted substantially from the common terminal 12B via the main current path of that semiconductor element T3. Hence these signal currents Ib1, Ib2 substantially do not contribute to the current Ic withdrawn by the transconductance stage 12. The current Ic therefore is Ii1 (1+P). If the transconductange stage has an amplification gm, then the input resistance amounts (1+P/gm which is independent of the current amplification of the controllable semiconductor elements T1, T2.

In the known circuit which does not include a controllable semiconductor element T3 as in the invention, the input resistance amounts (1+P)(1+1/α)gm Hence in the known circuit the input resistance is dependent on the amplification a of the controllable semiconductor elements. This is on its turn dependent on the current conducted by these elements. At low input currents the amplification α decreases, as a result of which the input resistance increases. This causes increasing signal losses at higher frequencies. In the circuit of the invention this phenomenon has been substantially annihilated.

Figure 4:
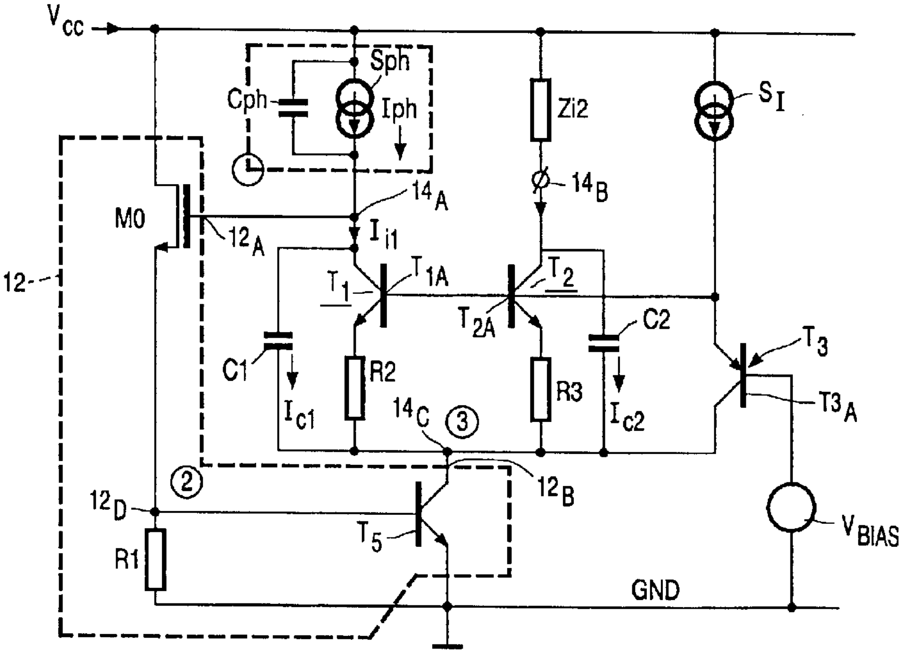
FIG. 4 is a second embodiment of a current mirror according to the invention.

FIG. 4 shows a second embodiment of the current mirror according to the invention. In FIG. 4 elements which have the same references are the same. This embodiment is characterized in that the first and the second semiconductor elements T1, T2 are bridged by a first and a second capacitive impedance C1, C2 having a capacitive value with a ratio of 1 to P. The first and the second capactive impedances C1, C2 will respectively conduct signal currents Ic1 and Ic2, having a ratio Ic2/Ic1=P. Hence the capacitive impedances C1, C2 contribute to the currents passing via the input and the output terminal 14A, 14B in the same ratio as the controllable semiconductor elements. As the frequency of the input signal of the current mirror increases and the amplification factors of the controllable semiconductor elements T1, T2 decreases the capacitive impedances C1, C2 gradually take over the function of the semiconductor elements T1, T2.

Figure 5:
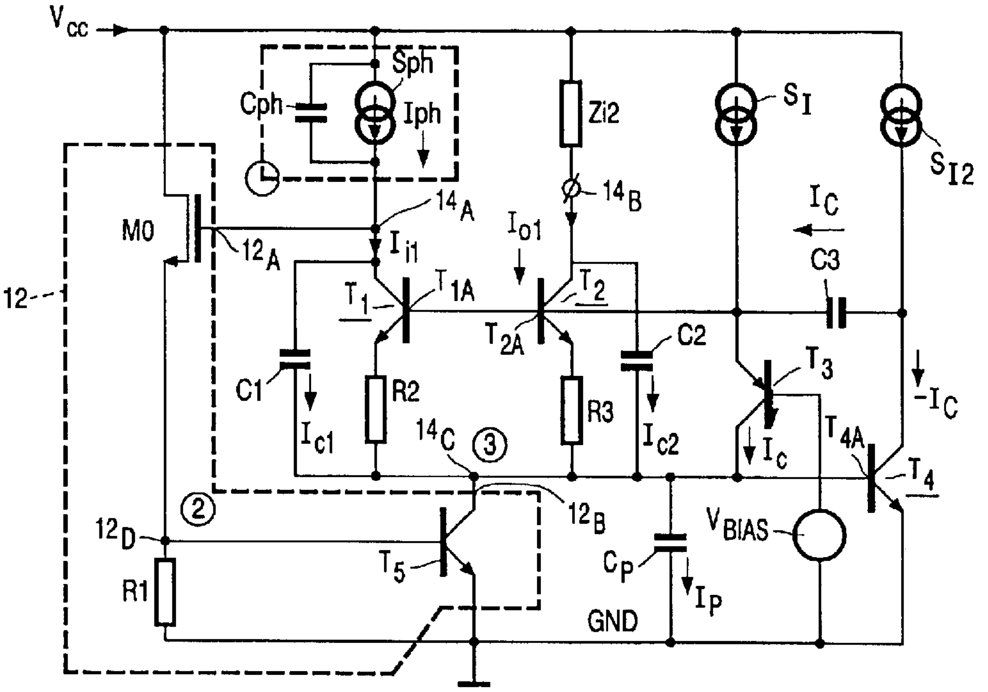
FIG. 5 is a third embodiment of a current mirror according to the invention.

FIG. 5 shows a third embodiment of the current mirror according to the invention. Parts of FIG. 5 having the same reference number as in FIG. 4 are identical. The embodiment shown is characterized in that the interconnected control electrodes T1A, T2A are further connected via a third capacitive impedance C3 and via a fourth controllable semiconductor element T4 to a reference voltage GND. A control electrode T4A of the fourth controllable semiconductor element T4 is coupled to the common terminal 14C.

As illustrated in FIG. 5, losses Ip may be caused by parasitic impedance Cp. However, as in this embodiment of the invention the parasitairy capacitor Cp, the bias voltage source, the base emitter transition of T3, the capacitive impedance C and the emitter base transition of T4 form a closed loop the sum of the voltages should be 0. From this it follows that the parasitic current Ip is completely compensated provided that the capacitance C3 is chosen equal to the parasitic capacitance Cp.

Figure 1:
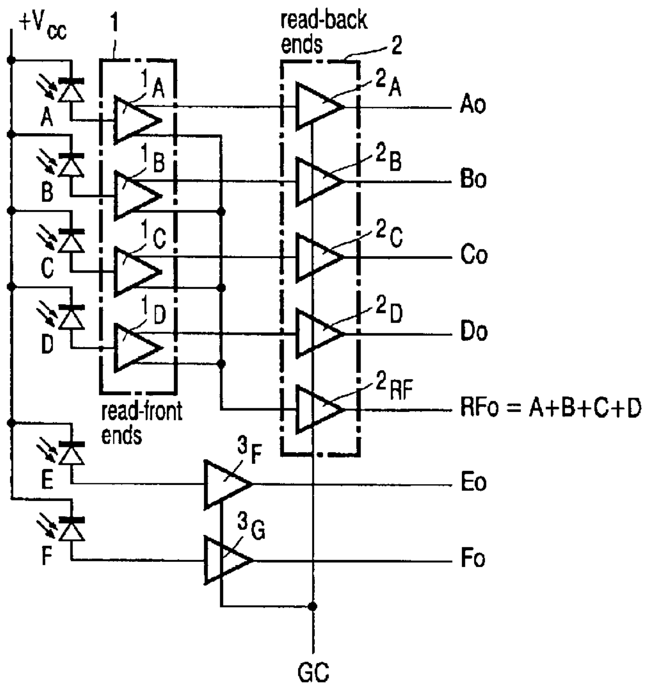
FIG. 1 is a schematic diagram of photodiodes.
Figure 6:
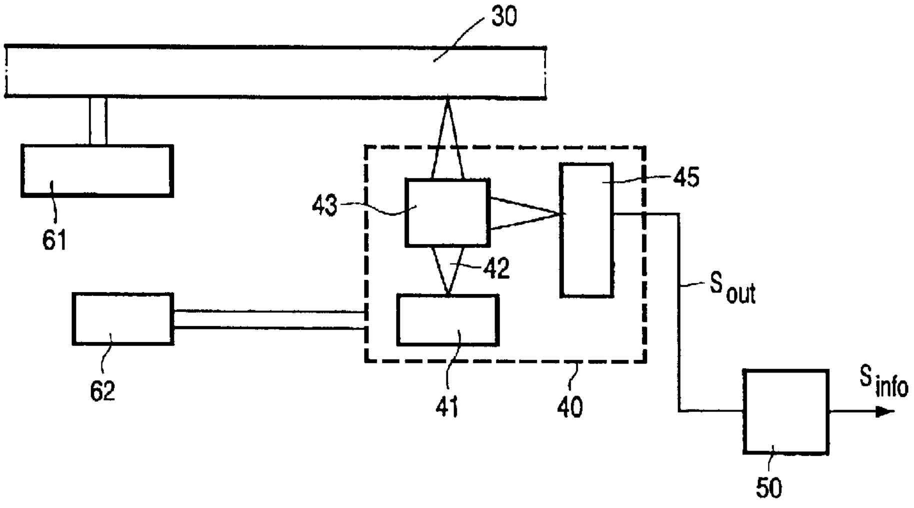
FIG. 6 is an arrangement for an optical record carrier.

FIG. 6 schematically shows an arrangement for reproducing an optical record carrier 30. The arrangement comprises a read head 40 including a radiation source 41 for generating a radiation beam 42. The read head further comprises an optical system 43 for directing the beam after interaction with the record carrier 30 to one or more photodiodes. The read head 40 also comprises a signal processing circuit with respective amplifiers comprising a current mirror circuit according to the invention, for example according to one of the embodiments shown in FIGS. 3, 4 and 5. The current mirror circuits each have an input coupled to one of the photodiodes. In the embodiment shown the photodiodes and the amplifiers are together integrated at an IC 45 as shown schematically in FIG. 1. A signal output of the signal processing circuit is coupled to a channel decoding circuit and/or an error correction circuit 50 for reconstructing an information stream Sinfo from the signal Sout provided by the signal processing circuit. The arrangement is provided with means 61, 62 for providing a relative movement between the read head 40 and the record carrier 30. In the embodiment shown the means 61 rotate the record carrier and the means 62 provide for a radial movement of the read head. Otherwise the means 61, 62 may for example be linear motors for moving the read head 40 and the record carrier respectively in mutually orthogonal directions.

It is remarked that the scope of protection of the invention is not restricted to the embodiments described herein. In the embodiments mainly bipolar transistors are shown. However, instead of bipolar transistors unipolar or MOSFET transistors can be used. In that case gate, source and drain of the unipolar transistor substitute respectively the base, emitter and collector, of the bipolar transistor. Multiple outputs are possible by providing copies of the transistor T2 between the common terminal 14C and additional output terminals 14B. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

What is claimed is:

1. Current mirror circuit including a current input terminal, a current output terminal and a common terminal, a first controllable semiconductor element arranged between the current input terminal and the common terminal, comprising:

a second controllable semiconductor element arranged between the current output terminal and the common terminal, the controllable semiconductor elements having interconnected control electrodes which are also coupled to a bias voltage source, for biasing said control electrodes at a reference voltage, the circuit further including a transconductance stage having an input coupled to the current input terminal and an output coupled to the common terminal, characterized in that the control electrodes are coupled to the common terminal via a third controllable semiconductor element, and in that the bias voltage source is coupled to the control electrodes of the first and the second controllable semiconductor element via a control electrode of the third controllable semiconductor element.

2. Current mirror circuit according to claim 1, characterized in that the interconnected control electrodes are further connected to a current source.

3. Current mirror circuit according to claim 1, characterized in that the first and the second semiconductor elements have an area ratio 1:P.

4. Current mirror circuit according to claim 3, characterized in that the first and the second semiconductor elements are bridged by a first and a second capacitive impedances having a capacitive value with a ratio of 1 to P.

5. Current mirror circuit according to claim 1, characterized in that the interconnected control electrodes are further connected via a third capacitive impedance and via a fourth controllable semiconductor element to a reference voltage, and that a control electrode of the fourth controllable semiconductor element is coupled to the common terminal.

6. Integrated circuit comprising at least one a current mirror circuit according to claim 1, and a photodiode having an output coupled to the current input terminal of said at least one current mirror circuit.

7. Arrangement for reproducing an optical record carrier, comprising:

a read head including a radiation source for generating a radiation beam, an optical system for directing the beam after interaction with the record carrier to one or more photodiodes, respective amplifiers comprising a current mirror circuit according to claim 1, each having an input coupled to one of the photodiodes, a channel decoding circuit and/or an error correction circuit for reconstructing an information stream from the signal provided by an amplifier, means for providing a relative movement between the read head and the record carrier.

8. The arrangement of claim 7, wherein the current mirror circuit further comprises the interconnected control electrodes are further connected to a current source.

9. The arrangement of claim 7, wherein the current mirror circuit further comprises the first and the second semiconductor elements have an area ratio 1:P.

10. The arrangement of claim 9, wherein the current mirror circuit further comprises the first and the second semiconductor elements are bridged by a first and a second capacitive impedances having a capacitive value with a ratio of 1 to P.

11. The arrangement of claim 7, wherein the current mirror circuit further comprises the interconnected control electrodes are further connected via a third capacitive impedance and via a fourth controllable semiconductor element to a reference voltage, and that a control electrode of the fourth controllable semiconductor element is coupled to the common terminal.

12. The arrangement of claim 7, further comprising at least one current mirror circuit, and a photodiode having an output coupled to the current input terminal of said at least one current mirror circuit.

* * * * *